(12) United States Patent
Park

(10) Patent No.: US 7,361,591 B2
(45) Date of Patent: Apr. 22, 2008

(54) METHOD OF FABRICATING SEMICONDUCTOR MEMORY DEVICE

(75) Inventor: Je-Min Park, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 98 days.

(21) Appl. No.: 11/279,364

(22) Filed: Apr. 11, 2006

(65) Prior Publication Data
US 2006/0226448 A1 Oct. 12, 2006

(30) Foreign Application Priority Data
Apr. 12, 2005 (KR) .................. 10-2005-0030501

(51) Int. Cl.
*H01L 82/42* (2006.01)
(52) U.S. Cl. ............... 438/652; 438/672; 257/E21.649; 257/E21.658
(58) Field of Classification Search ................ 438/652, 438/672; 257/E21.649, E21.658
See application file for complete search history.

(56) References Cited

U.S. PATENT DOCUMENTS

| | | | | |
|---|---|---|---|---|
| 7,074,667 B2* | 7/2006 | Cho et al. | ................... | 438/238 |
| 2005/0142756 A1* | 6/2005 | Park et al. | ................... | 438/258 |
| 2006/0226448 A1* | 10/2006 | Park | ........................... | 257/204 |
| 2006/0284229 A1* | 12/2006 | Park | ........................... | 257/304 |

FOREIGN PATENT DOCUMENTS

| | | |
|---|---|---|
| JP | 07-066297 | 3/1995 |
| JP | 11-186522 | 7/1999 |
| KR | 2000-0015029 | 3/2000 |
| KR | 2000-0021387 | 4/2000 |
| KR | 10-2004-0033631 | 4/2004 |
| KR | 10-2004-0069585 | 8/2004 |

OTHER PUBLICATIONS

English language abstract of Korean Publication 2000-0015029.
English language abstract of Korean Publication No. 2000-0021387.
English language abstract of Japanese Publication No. 07-066297.
English language abstract of Japanese Publication No. 11-186522.

* cited by examiner

*Primary Examiner*—George Fourson
(74) *Attorney, Agent, or Firm*—Marger Johnson & McCollom, P.C.

(57) ABSTRACT

A method includes preparing a semiconductor substrate having a cell region, a core NMOS region, and a core PMOS region; defining a cell active region, an NMOS active region, and a PMOS active region in the cell region, the core NMOS region, and the core PMOS region, respectively, by forming an isolation layer in predetermined regions of the semiconductor substrate; forming a cell gate pattern, an NMOS gate pattern, and a PMOS gate pattern crossing the cell active region, the NMOS active region, and the PMOS active region, respectively; forming an interlayer-insulating layer on the semiconductor substrate having the gate patterns; simultaneously forming a storage node landing pad, a bit line landing pad, and NMOS landing pads; and patterning the interlayer-insulating layer of the core PMOS region to form PMOS interconnection contact holes that expose predetermined regions of the PMOS active region adjacent to the PMOS gate pattern.

12 Claims, 16 Drawing Sheets

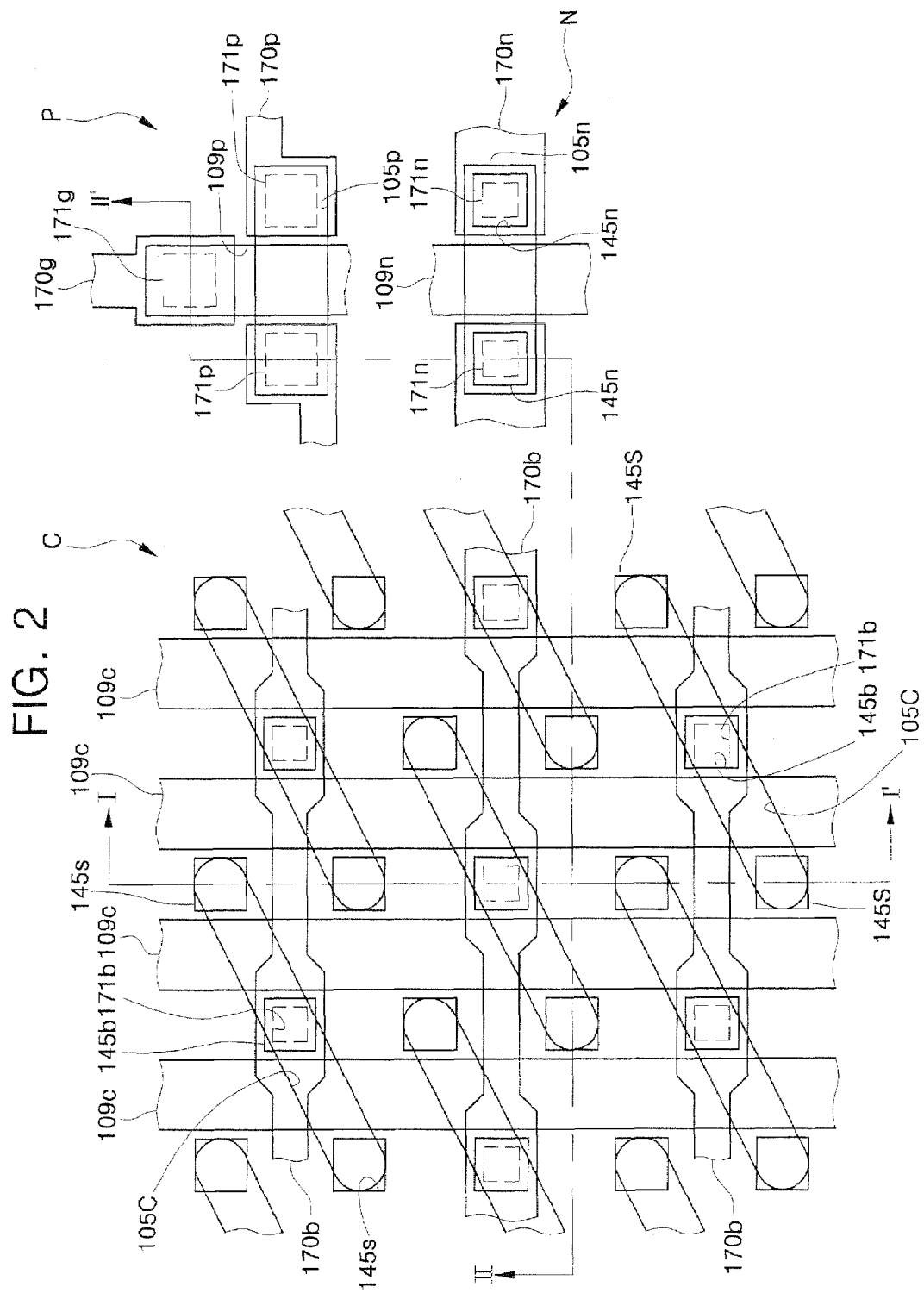

METHOD OF FABRICATING SEMICONDUCTOR MEMORY DEVICE

CROSS-REFERENCE TO RELATED APPLICATIONS

This application claims priority from Korean Patent Application No. 10-2005-0030501, which was filed on 12 Apr. 2005. Korean Patent Application No. 10-2005-0030501 is incorporated by reference.

BACKGROUND

1. Technical Field

This disclosure relates to a method of fabricating a semiconductor device and a semiconductor device fabricated thereby, and more particularly, to a method of fabricating a semiconductor device capable of simplifying a direct contact process and a semiconductor device fabricated thereby.

2. Description of the Related Art

As electronic products become thinner and smaller, research is actively conducted on the high integration technology of semiconductor devices used in the electronic products. The high integration technology includes technology for reducing the physical size of components for semiconductor devices and technology for effectively arranging the components in the semiconductor devices. For example, a semiconductor memory device such as a dynamic random access memory (DRAM) includes a plurality of memory cells. The memory cell has a cell transistor, a cell capacitor, and an interconnection. A structure having an area of $8F^2$ is widely employed for the memory cell. In addition, technologies for reducing the area of the memory cell to $6F^2$ or $4F^2$ are widely researched. In this case, F denotes the minimum feature size.

A description can be made for the memory device divided to a memory cell region and a core and peripheral region. Transistors are formed in each region, and the isolated predetermined regions must be electrically connected to each other using a metal interconnection to operate the transistors.

FIGS. 1A to 1E are cross-sectional diagrams illustrating a conventional method of fabricating a semiconductor device. In FIGS. 1A to 1E, the letters "CA" denote a cell region, and the letters "CP" denote a core region.

Referring to FIG. 1A, a semiconductor substrate 1 having a cell region CA and a core region CP is prepared. A trench isolation layer 5 is formed in the semiconductor substrate 1 to define a cell active region 5c and a core active region 5p. A cell gate pattern 9c and a core gate pattern 9p are formed across the cell active region 5c and the core active region 5p, respectively. The cell gate pattern 9c and the core gate pattern 9p may be composed of gate dielectric layers (not shown), gate electrodes 10c and 10p, and capping layer patterns 20c and 20p, respectively, which are sequentially stacked. Subsequently, gate spacers 25 are formed to cover sidewalls of the gate patterns 9c and 9p. Impurity ions may be selectively implanted into the semiconductor substrate of the cell active region 5c using the cell gate pattern 9c and the trench isolation layer 5 as ion implantation masks to form a cell source region 30s and a cell drain region 30d. Similarly, impurity ions may be selectively implanted into the semiconductor substrate of the core active region 5p to form core source and drain regions 30p. Consequently, a cell transistor is formed in the cell region CA of the semiconductor substrate, and a core transistor is formed in the core region CP of the semiconductor substrate. In this case, the core transistor may be an N-channel metal oxide semiconductor (NMOS) transistor or a p-channel MOS (PMOS) transistor. A lower interlayer-insulating layer 35 having a flat top surface is formed on the semiconductor substrate having the gate patterns 9c and 9p.

Referring to FIG. 1B, a storage node landing pad 45s and a bit line landing pad 45b are formed in the lower interlayer-insulating layer 35 of the cell region CA by a typical self-alignment method. Specifically, the lower interlayer-insulating layer 35 of the cell region CA is patterned to form contact holes for exposing the cell source region 30s and the cell drain region 30d, respectively. Subsequently, a pad conductive layer is formed on the lower interlayer-insulating layer 35 to fill the contact holes. The pad conductive layer is planarized until a top surface of the lower interlayer-insulating layer 35 is exposed, so that the pad conductive layer remains in the contact holes. As a result, a storage node landing pad 45s contacting the cell source region 30s and a bit line landing pad 45b contacting the cell drain region 30d are formed in the lower interlayer-insulating layer 35 of the cell region CA.

Referring to FIG. 1C, an upper interlayer-insulating layer 50 is formed on the entire surface of the semiconductor substrate having the landing pads 45s and 45b. A first photoresist layer pattern 55 is formed on the upper interlayer-insulating layer 50 to expose a top surface of the bit line landing pad 45b. The upper interlayer-insulating layer 50 is etched using the first photoresist layer pattern 55 as an etch mask to form a direct contact hole for bit line 60 which exposes a predetermined region of the bit line landing pad 45b.

Referring to FIG. 1D, the first photoresist layer pattern (55 in FIG. 1C) is removed. Subsequently, a second photoresist layer pattern 65 is formed on the upper interlayer-insulating layer 50 to expose top surfaces of the core source and drain regions 30p of the core region CP. The upper interlayer-insulating layer 50 is etched using the second photoresist layer pattern 65 as an etch mask to form a direct contact hole for core metal interconnection 70 which exposes the core source and drain regions 30p.

Referring to FIG. 1E, the second photoresist layer pattern (65 in FIG. 1) is removed. An interconnection conductive layer is formed on the upper interlayer-insulating layer 50 to fill the bit line direct contact hole 60 and the core metal interconnection direct contact hole 70. Subsequently, the interconnection conductive layer is patterned to form a bit line 75b electrically connected to the bit line landing pad 45 and to concurrently form core metal interconnections 75p electrically connected to the core source and drain regions 30p.

As described above, according to the conventional method of fabricating the semiconductor device using the self alignment method, the processes of forming the bit line direct contact hole 60 and the core metal interconnection direct contact hole 70 in the interlayer-insulating layer must be separately carried out. In highly integrated semiconductor devices, this increases the time and cost associated with fabricating the semiconductor device.

Embodiments of in the invention address these and other disadvantages of the conventional art.

SUMMARY

Embodiments of the invention provide a method of fabricating a semiconductor device which is capable of simplifying a direct contact process, and a semiconductor device fabricated thereby.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

FIG. 2 is a plan diagram illustrating a semiconductor device in accordance with exemplary embodiments of the invention.

DETAILED DESCRIPTION

Figure 1A:
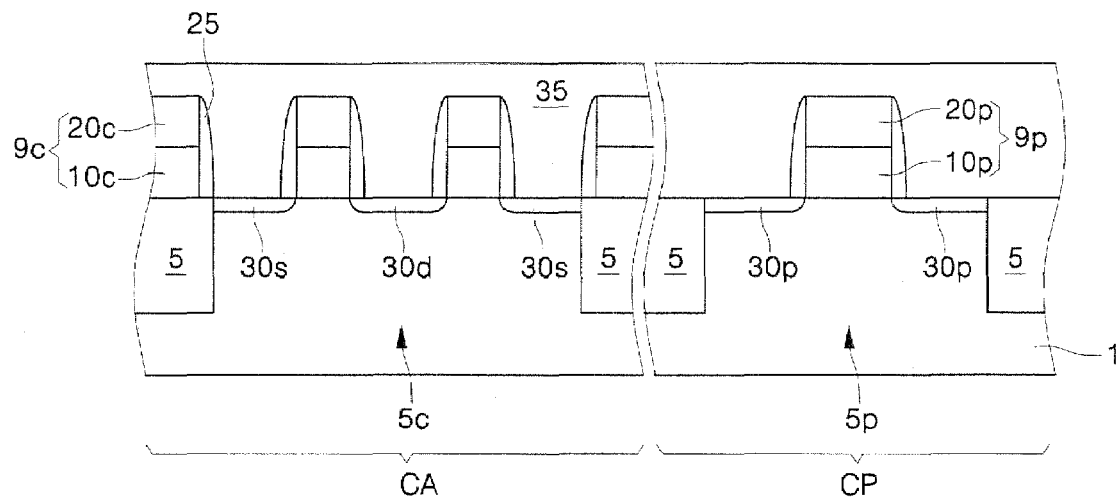
FIGS. 1A to 1E are cross-sectional diagrams illustrating a conventional method of fabricating a semiconductor device.
Figure 1B:
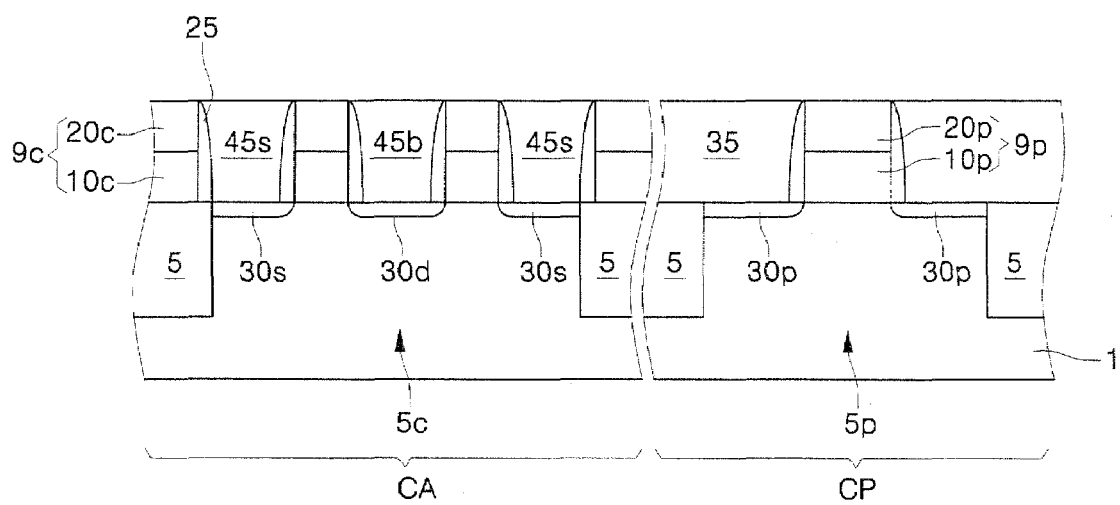
Figure 1C:
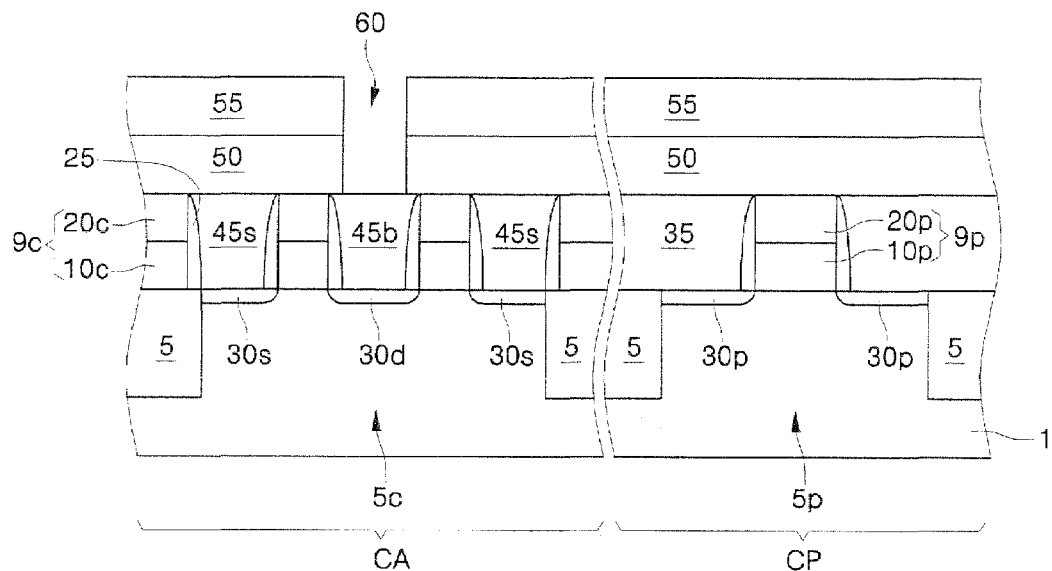
Figure 1D:
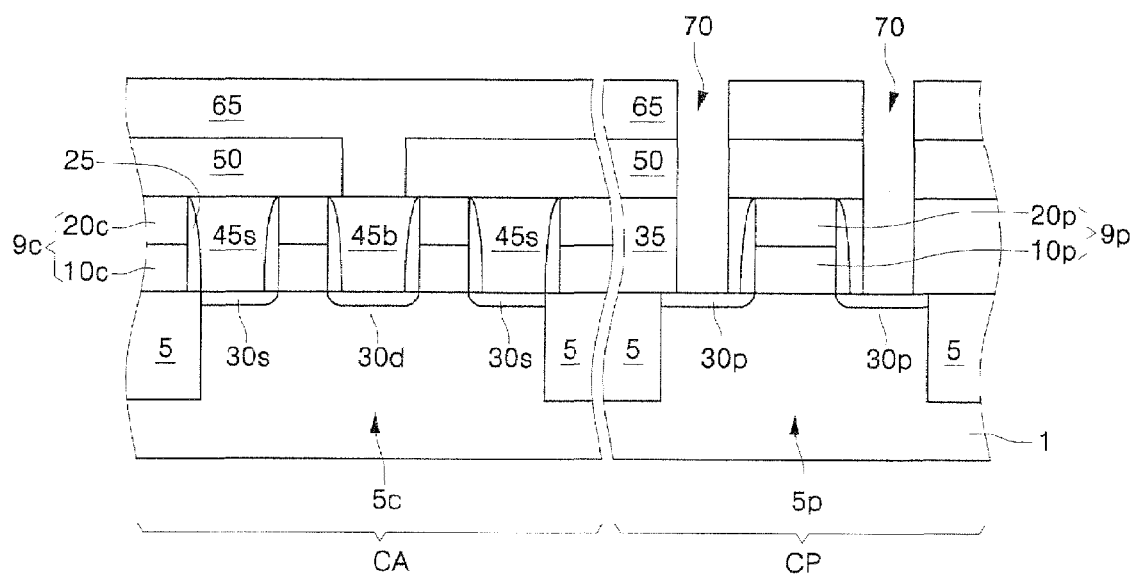
Figure 1E:
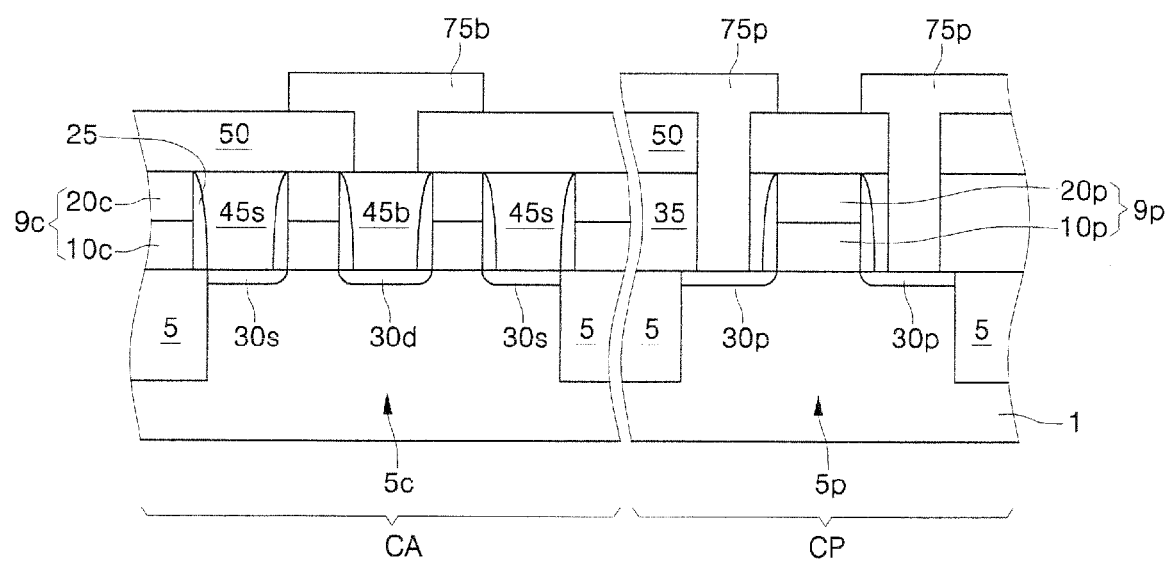

The invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIG. 2 is a plan diagram illustrating a semiconductor device in accordance with exemplary embodiments of the invention. FIGS. 3A, 4A, 5A, 6A, 7A, and 8A are cross-sectional diagrams taken along the line I-I' of FIG. 2 illustrating methods of fabricating a semiconductor device in accordance with exemplary embodiments of the invention. FIGS. 3B, 4B, 5B, 6B, 7B, and 8B are cross-sectional diagrams taken along the line II-II' of FIG. 2 illustrating methods of fabricating a semiconductor device in accordance with exemplary embodiments of the invention. In FIGS. 3A, 4A, 5A, 6A, 7A, 8A, 3B, 4B, 5B, 6B, 7B, and 8B, a reference symbol "C" denotes a cell region, a reference symbol "N" denotes a core NMOS region, and a reference symbol "P" denotes a core PMOS region.

Figure 3A:
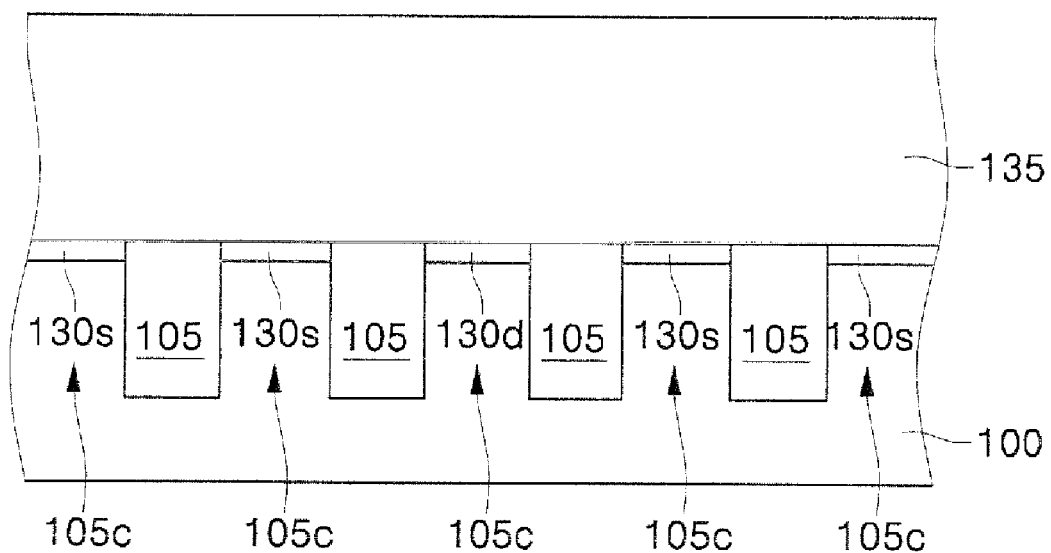
FIGS. 3A, 4A, 5A, 6A, 7A, and 8A are cross-sectional diagrams taken along the line I-I' of FIG. 2 illustrating methods of fabricating a semiconductor device in accordance with exemplary embodiments of the invention.
Figure 3B:
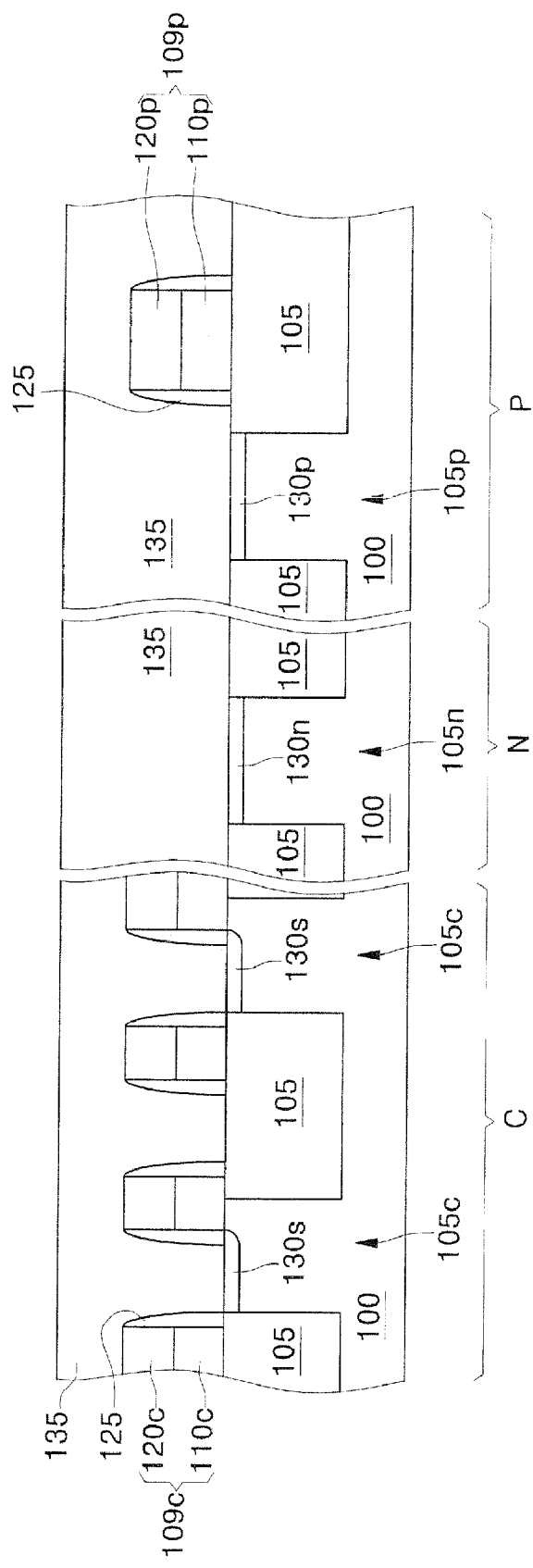
FIGS. 3B, 4B, 5B, 6B, 7B, and 8B are cross-sectional diagrams taken along the line II-II' of FIG. 2 illustrating methods of fabricating a semiconductor device in accordance with exemplary embodiments of the invention.

Referring to FIGS. 2, 3A, and 3B, a semiconductor substrate 100 having a cell region C, a core NMOS region N, and a core PMOS region P is prepared. A cell transistor, an NMOS transistor, and a PMOS transistor are formed in the cell region C, the core NMOS region N, and the core PMOS region P of the semiconductor substrate, respectively. Specifically, an isolation layer 105 is formed in a predetermined region of the semiconductor substrate 100 to define a cell active region 105c, an NMOS active region 105n, and a PMOS active region 105p in the cell region C, the core NMOS region N, and the core PMOS region P, respectively.

The isolation layer 105 may be formed by a shallow trench isolation (STI) process. The cell active regions 105c may be formed in the shape of a bar as shown in FIG. 2. The isolation layer 105 may be formed of a silicon oxide layer, e.g. a high-density plasma (HDP) oxide layer. A cell gate pattern 109c, an NMOS gate pattern 109n, and a PMOS gate pattern 109p are formed across the cell active region 105c, the NMOS active region 105n, and the PMOS active region 105p, respectively. In this case, the cell gate pattern 109c may be formed parallel to adjacent cell gate patterns.

Each of the gate patterns 109c, 109n, and 109p may be composed of a gate dielectric layer, a gate electrode, and a capping layer pattern which are sequentially stacked. The gate electrode and the capping layer pattern which are sequentially stacked may extend onto the isolation layer 105. Specifically, the cell gate pattern 109c may be composed of a gate dielectric layer (not shown), a cell gate electrode 110c, and a cell capping layer pattern 120c which are sequentially stacked. The NMOS gate pattern 109n may be composed of a gate dielectric layer, an NMOS gate electrode, and an NMOS capping layer pattern which are sequentially stacked. The PMOS gate pattern 109p may be composed of a gate dielectric layer (not shown), a PMOS gate electrode 110p, and a PMOS capping layer pattern 120p which are sequentially stacked. The gate dielectric layers may be formed of a silicon oxide layer or a high-k dielectric layer. The gate electrodes may be formed of a polysilicon layer or a metal layer. When the gate electrodes are formed of a polysilicon layer, a metal silicide layer may be formed on the polysilicon layer to enhance conductivity of the polysilicon layer. The metal silicide layer may be formed of a tungsten silicide layer, a titanium silicide layer, or a cobalt silicide layer. The capping insulating layers may be formed of a silicon nitride layer.

Gate spacers 125 may be formed to cover sidewalls of the gate patterns 109c, 109n, and 109p. The gate spacers 125 may be formed of a silicon oxide layer or a silicon nitride layer.

Impurity ions are implanted into the active regions 105c, 105n, and 105p of the semiconductor substrate using the gate patterns 109c, 109n, and 109p and the isolation layer 105 as ion implantation masks to form source and drain regions 130s, 130d, 130n, and 130p. In particular, N-type impurity ions may be implanted into the cell active region 105c and the NMOS active region 105n of the semiconductor substrate using the cell gate pattern 109c and the NMOS gate pattern 109n as ion implantation masks to form cell source and drain regions 130s and 130d, and NMOS source and drain regions 130n, respectively. Similarly, P-type impurity ions may be implanted into the PMOS active region 105p of the semiconductor substrate using the PMOS gate pattern 109p as an ion implantation mask to form PMOS source and drain regions 130p. Consequently, a cell transistor, an NMOS transistor, and a PMOS transistor are formed in the cell active region 105c, the NMOS active region 105n, and the PMOS active region 105p, respectively. In this case, each of the transistors may include a gate pattern and source and drain regions.

In the meantime, two cell transistors may be formed on one cell active region 105c. That is, a pair of parallel cell gate patterns 109c may cross the cell active region 105c as shown in FIG. 2. The cell gate patterns 109c may cross the cell active region 105c to extend onto the isolation layer 105. As a result, a pair of cell transistors sharing one common drain region 130d may be formed on the cell active region 105c.

An interlayer-insulating layer 135 is formed on the surface of the semiconductor substrate 100 having the transistors. The interlayer-insulating layer 135 preferably has a flat top surface. The interlayer-insulating layer 135 has a top surface higher than top surfaces of the gate patterns. The interlayer-insulating layer 135 may have a top surface that is higher than the top surfaces of the gate patterns by about 500 Å to 4000 Å. The interlayer-insulating layer 135 may be formed of a silicon oxide layer.

Figure 4A:
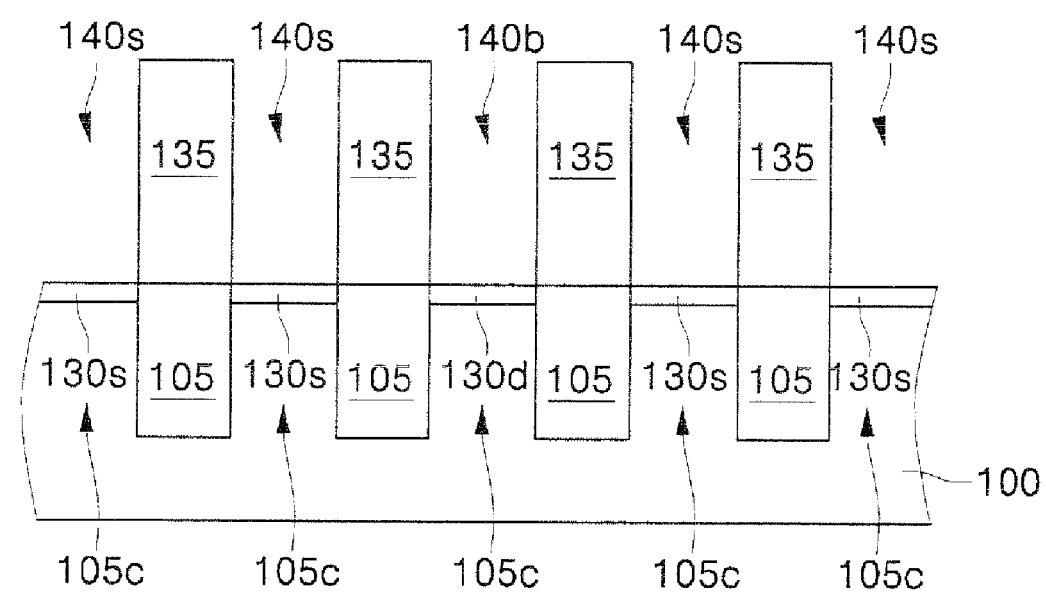
Figure 4B:
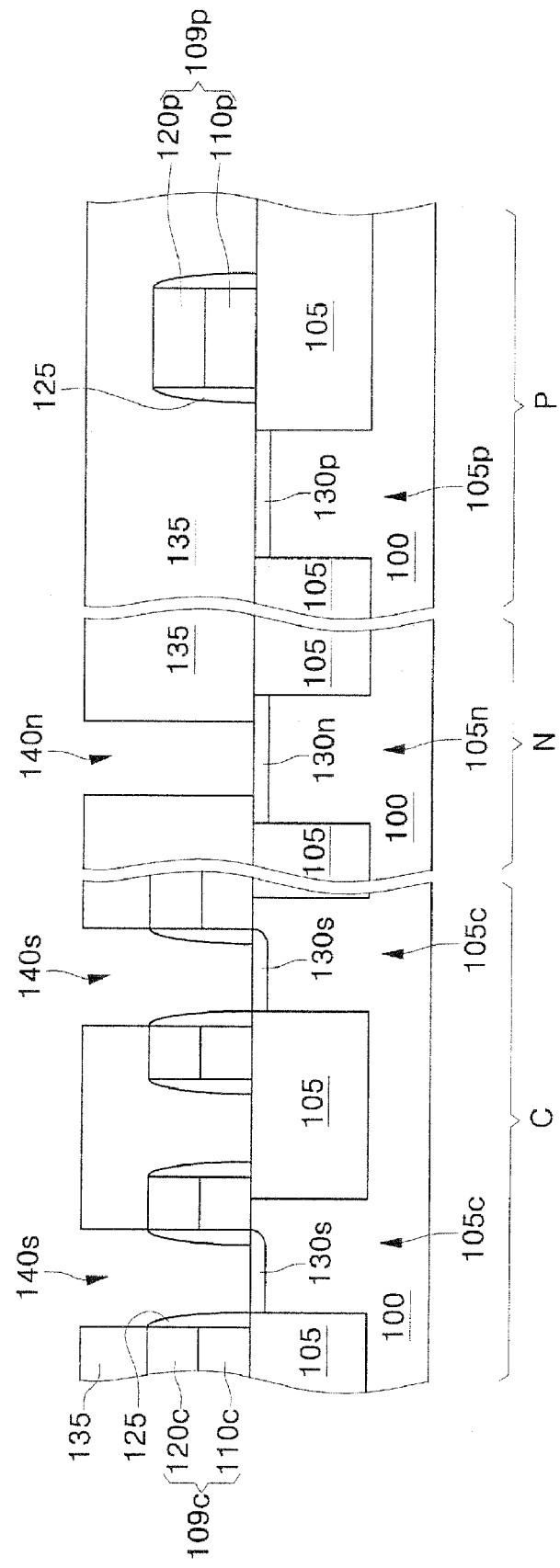

Referring to FIGS. 2, 4A, and 4B, the interlayer-insulating layer 135 of the cell region C and the core NMOS region N is patterned to form a storage node contact hole 140s and a bit line contact hole 140b for exposing predetermined regions of the cell active region 105c adjacent to the cell gate pattern 109c, respectively, and to form NMOS interconnection contact holes 140n for exposing predetermined regions of the NMOS active region 105n adjacent to the NMOS gate pattern 109n. That is, the interlayer-insulating layer 135 of the cell region C and the core NMOS region N is patterned to form the storage node contact hole 140s and the bit line contact hole 140b for exposing the cell source region 130s and the cell drain region 130d of the cell transistor, respectively, and to form the NMOS interconnection contact holes 140s for exposing the NMOS source and drain regions 130n of the NMOS transistor.

Figure 5A:
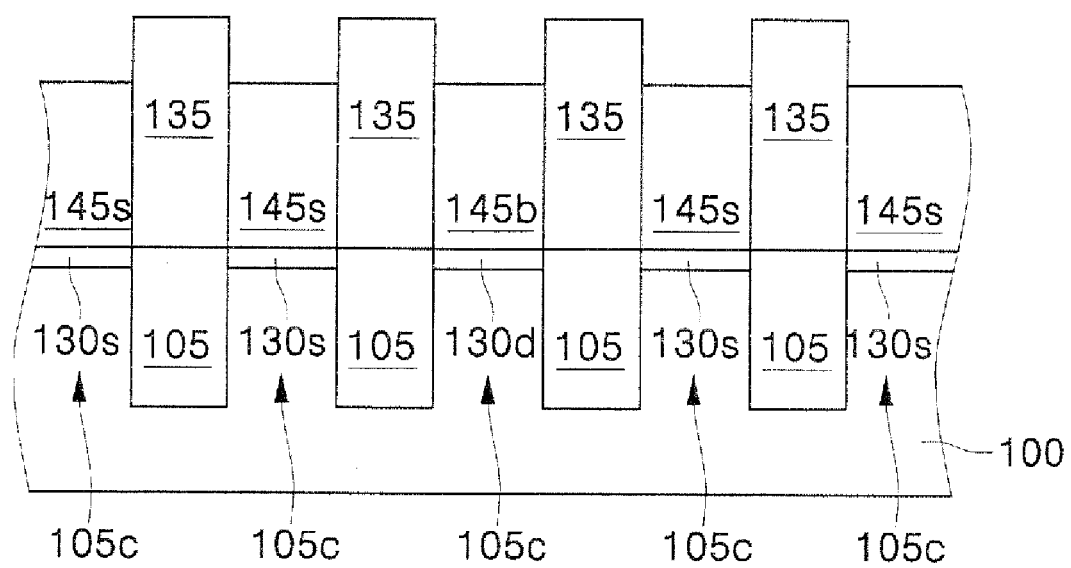
Figure 5B:
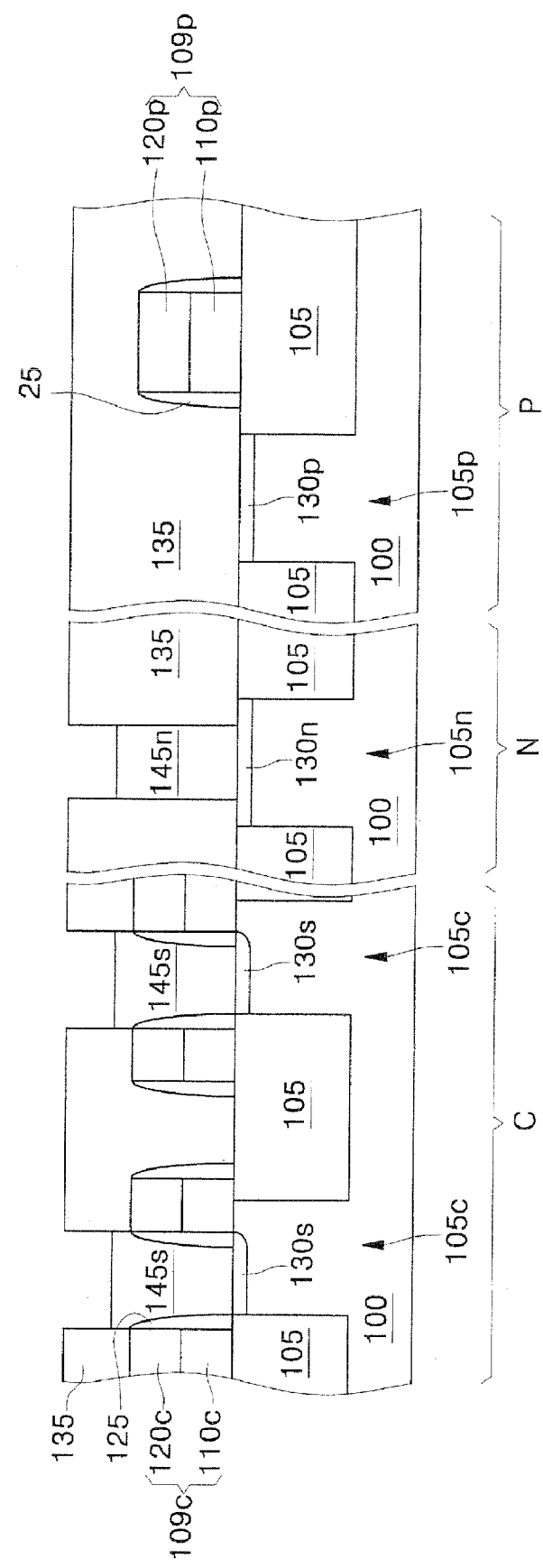

Referring to FIGS. 2, 5A, and 5B, a storage node landing pad 145s and a bit line landing pad 145b which are in contact with predetermined regions of the cell active region 105c adjacent to the cell gate pattern 109c, respectively, are formed in the interlayer-insulating layer of the cell region C while NMOS landing pads 145n which are in contact with predetermined regions of the NMOS active region 105n adjacent to the NMOS gate pattern 109n are formed in the interlayer-insulating layer of the core NMOS region N. In this case, each of the landing pads 145s, 145b, and 145n has a top surface lower than the surface of the interlayer-insulating layer 135. The storage node landing pad 145s is in contact with the cell source region 130s of the cell transistor, the bit line landing pad 145b is in contact with the cell drain region 130d of the cell transistor, and the NMOS landing pads 145n are in contact with the NMOS source and drain regions 130n of the NMOS transistor.

Specifically, a pad conductive layer is formed on the interlayer-insulating layer 135 to fill the storage node contact hole 140s, the bit line contact hole 140b, and the NMOS interconnection contact holes 140n. The pad conductive layer may be formed of a polysilicon layer or a pad metal layer. The pad metal layer may be formed of a tungsten layer. Subsequently, the pad conductive layer is selectively etched to form a storage node landing pad 145s, a bit line landing pad 145b, and NMOS landing pads 145n which expose the top surface of the interlayer-insulating layer 135 and remain in lower regions of the contact holes 140s, 140b, and 140n, respectively. As a result, there occurs a step between the interlayer-insulating layer 135 and each of the landing pads 145s, 145b, and 145n. Accordingly, upper sidewalls of the contact holes 140s, 140b, and 140n are exposed by the step between the interlayer-insulating layer 135 and each of the landing pads 145s, 145b, and 145n.

Figure 6A:
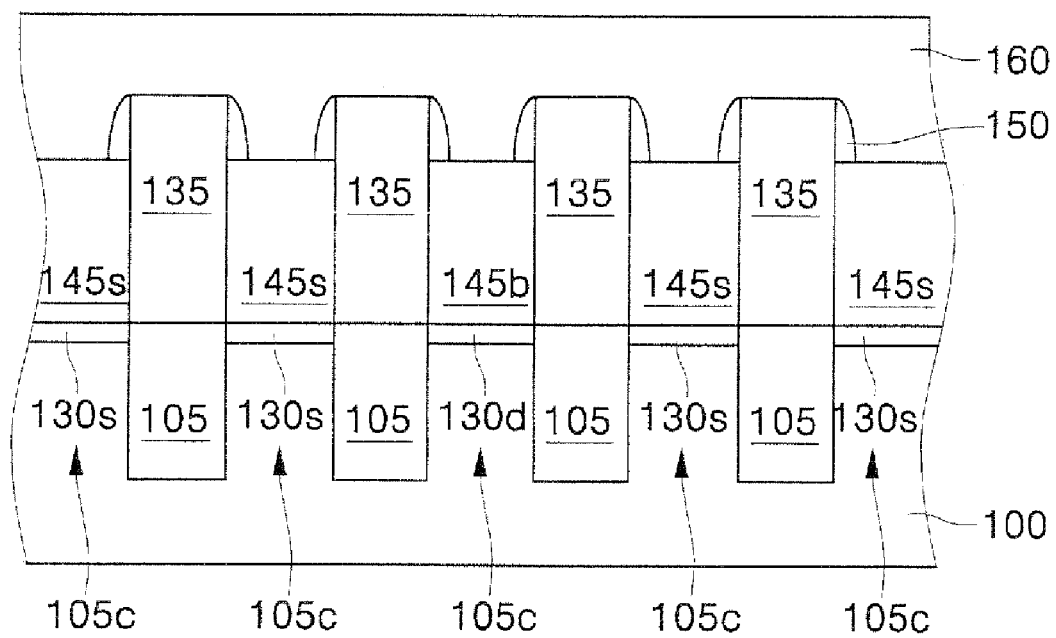
Figure 6B:
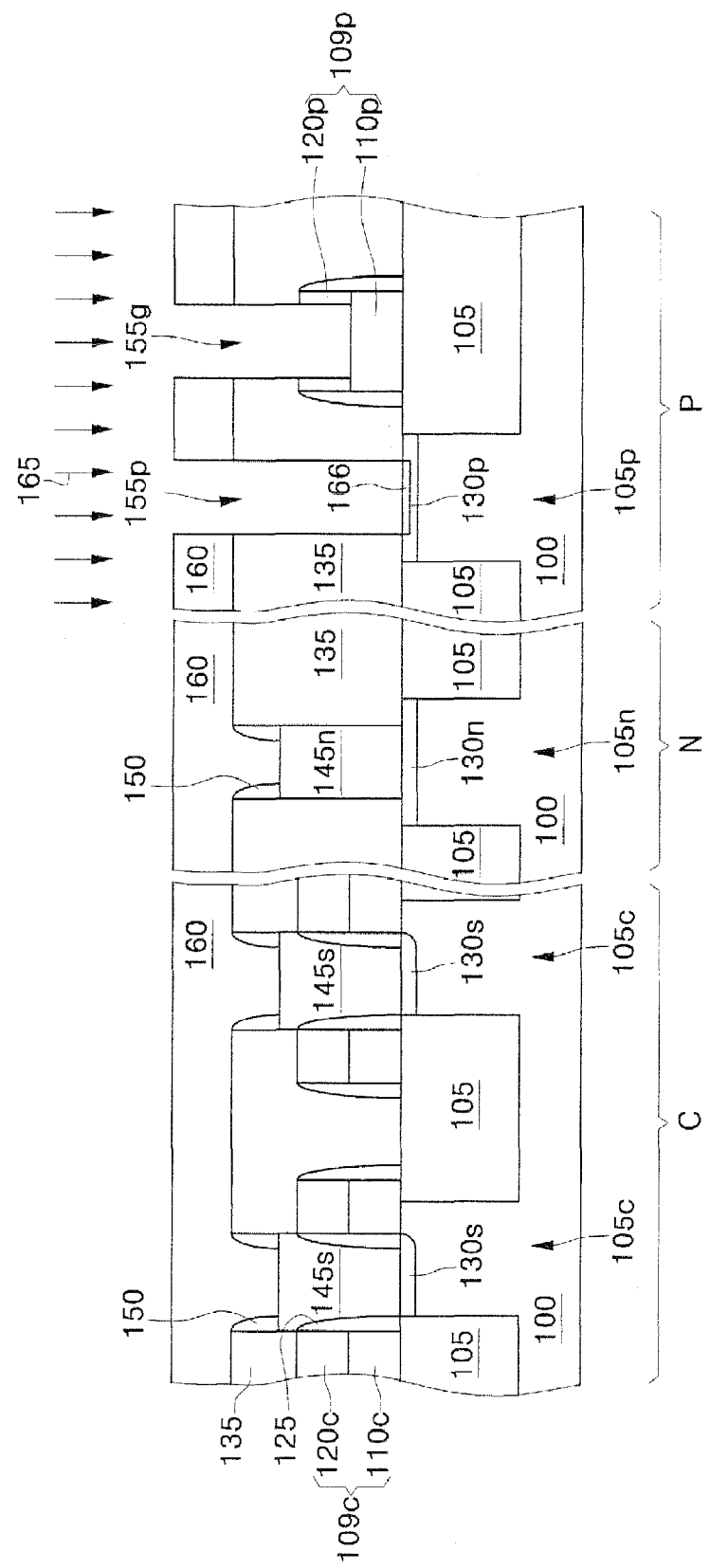

Referring to FIGS. 2, 6A, and 6B, insulating spacers 150 are formed to cover the exposed upper sidewalls of the contact holes 140s, 140b, and 140n. Specifically, a spacer insulating layer is formed on the entire surface of the semiconductor substrate having the landing pads 145s, 145b, and 145n. The spacer insulating layer may be conformally formed. Subsequently, anisotropic etching is carried out on the spacer insulating layer until top surfaces of the landing pads 145s, 145b, and 145n are exposed. As a result, the insulating spacers 150 can be formed to cover the upper sidewalls of the contact holes 140s, 140b, and 140n exposed by the step between the interlayer-insulating layer 135 and each of the landing pads 145s, 145b, and 145n. The insulating spacers 150 may be formed of a silicon oxide layer or a silicon nitride layer.

The interlayer-insulating layer 135 of the core PMOS region P is patterned to form PMOS interconnection contact holes 155p for exposing predetermined regions of the PMOS active region 105p. Specifically, a photoresist layer pattern 160 is formed on the interlayer-insulating layer 135 to open top surfaces of the source and drain regions 130p of the PMOS transistor. Subsequently, the interlayer-insulating layer 135 is etched using the photoresist layer pattern 160 as an etch mask to form the PMOS interconnection contact holes 155p for exposing the source and drain regions 130p of the PMOS transistor.

Further, impurity ions 165 may be implanted into the PMOS source and drain regions 130p exposed by the PMOS interconnection contact holes 155p using the photoresist layer pattern 160 as an ion implantation mask to thereby form impurity regions 166. That is, in order to improve contact resistance at the PMOS source and drain regions 130p, the impurity ions 165 may be implanted into the PMOS source and drain regions 130p to form the impurity regions 166. The impurity ions 165 implanted into the PMOS source and drain regions 130p may be P-type impurity ions.

In the meantime, a PMOS gate interconnection contact hole 155g for exposing a direct contact region of the PMOS gate pattern 109p may be formed while the PMOS interconnection contact holes 155p are formed. In particular, a photoresist layer pattern 160 may be formed to expose a top surface of the direct contact region of the PMOS gate pattern 109p while opening top surfaces of the PMOS source and drain regions 130p. Subsequently, the interlayer-insulating layer 135 may be etched using the photoresist layer pattern 160 as an etch mask to form the PMOS interconnection contact holes 155p and the PMOS gate interconnection contact hole 155g for exposing the PMOS source and drain regions 130p and the direct contact region of the PMOS gate pattern 109p, respectively. In this case, the direct contact region of the PMOS gate pattern 109p may be a predetermined region of the PMOS gate electrode 110p.

Further, although not shown in the drawings, a cell gate interconnection contact hole and an NMOS gate interconnection contact hole for exposing direct contact regions of the cell gate pattern 109c and the NMOS gate pattern 109n may be formed, respectively, while the PMOS gate interconnection contact hole 155g is formed. That is, gate interconnection contact holes for exposing predetermined regions of the gate electrodes may be formed, respectively, while the PMOS interconnection contact holes 155p are formed.

Figure 7A:
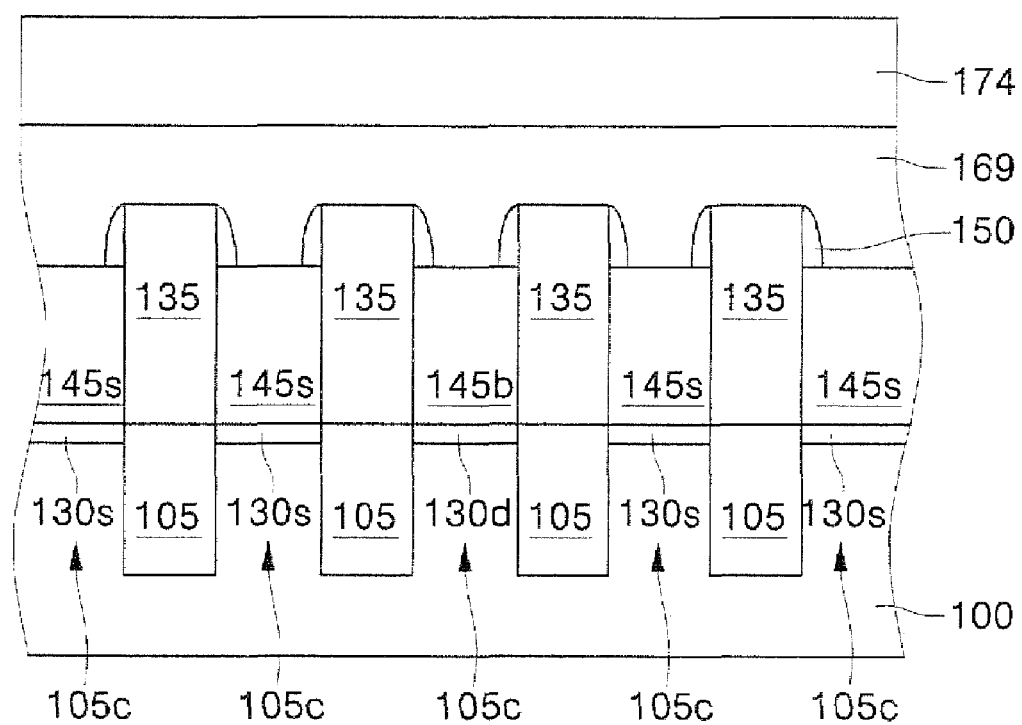
Figure 7B:
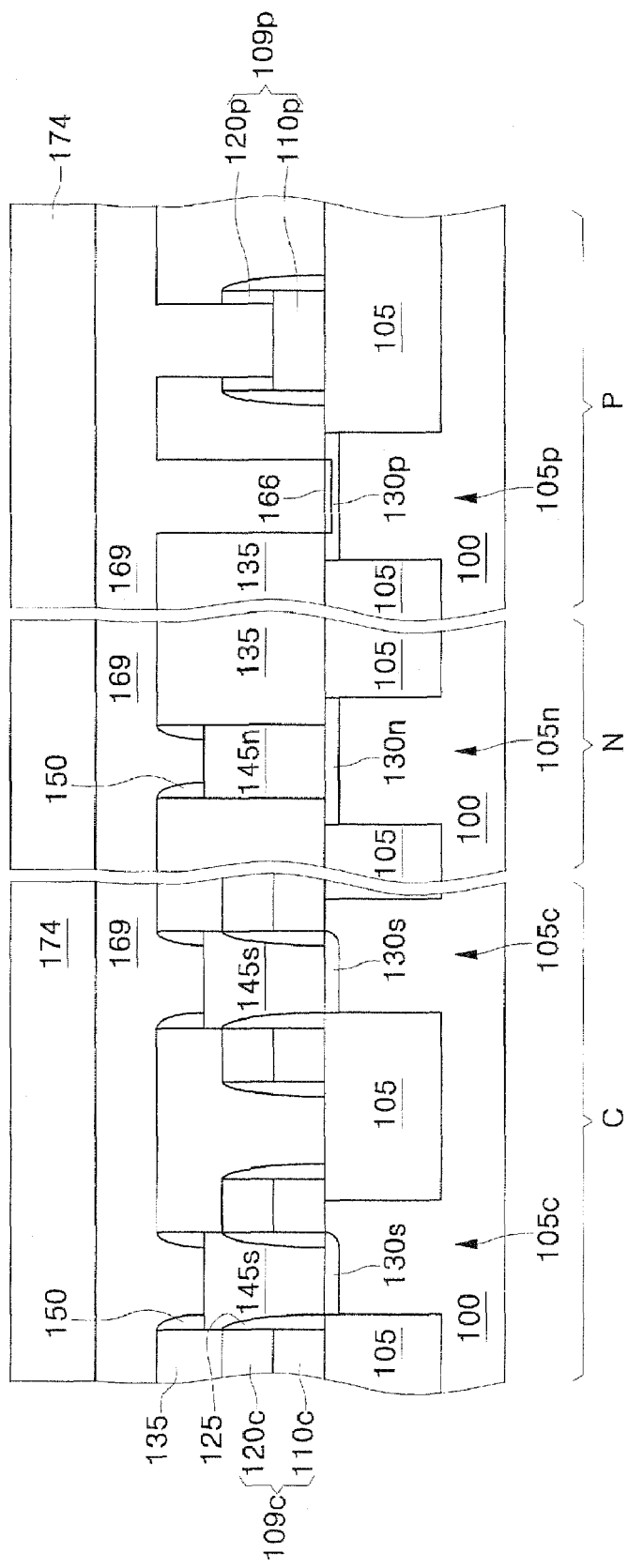

Referring to FIGS. 2, 7A, and 7B, the photoresist layer pattern (160 in FIG. 6) is removed. An interconnection conductive layer 169 is formed on the entire surface of the interlayer-insulating layer 135 to fill the PMOS interconnection contact holes 155p and the PMOS gate interconnection contact hole 155g. The interconnection conductive layer 169 may be formed of a polysilicon layer or an interconnection metal layer. The interconnection metal layer may be formed of a tungsten layer. A hard mask insulating layer 174 may be formed on the interconnection conductive layer 169. The hard mask insulating layer 174 may be formed of a silicon nitride layer.

Figure 8A:
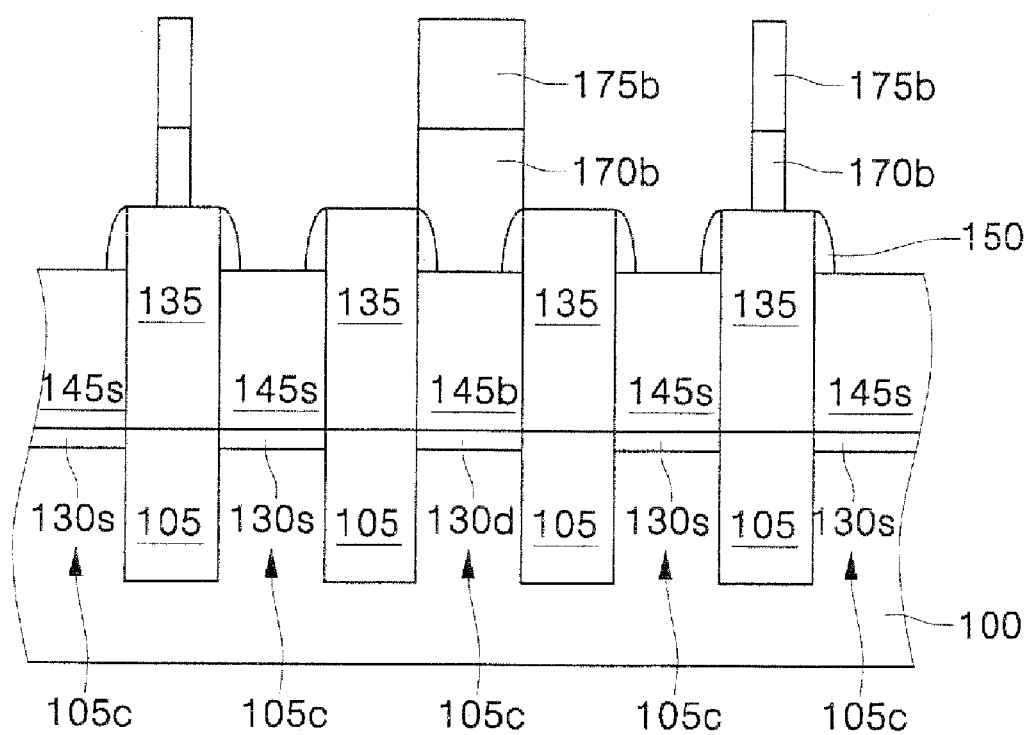
Figure 8B:
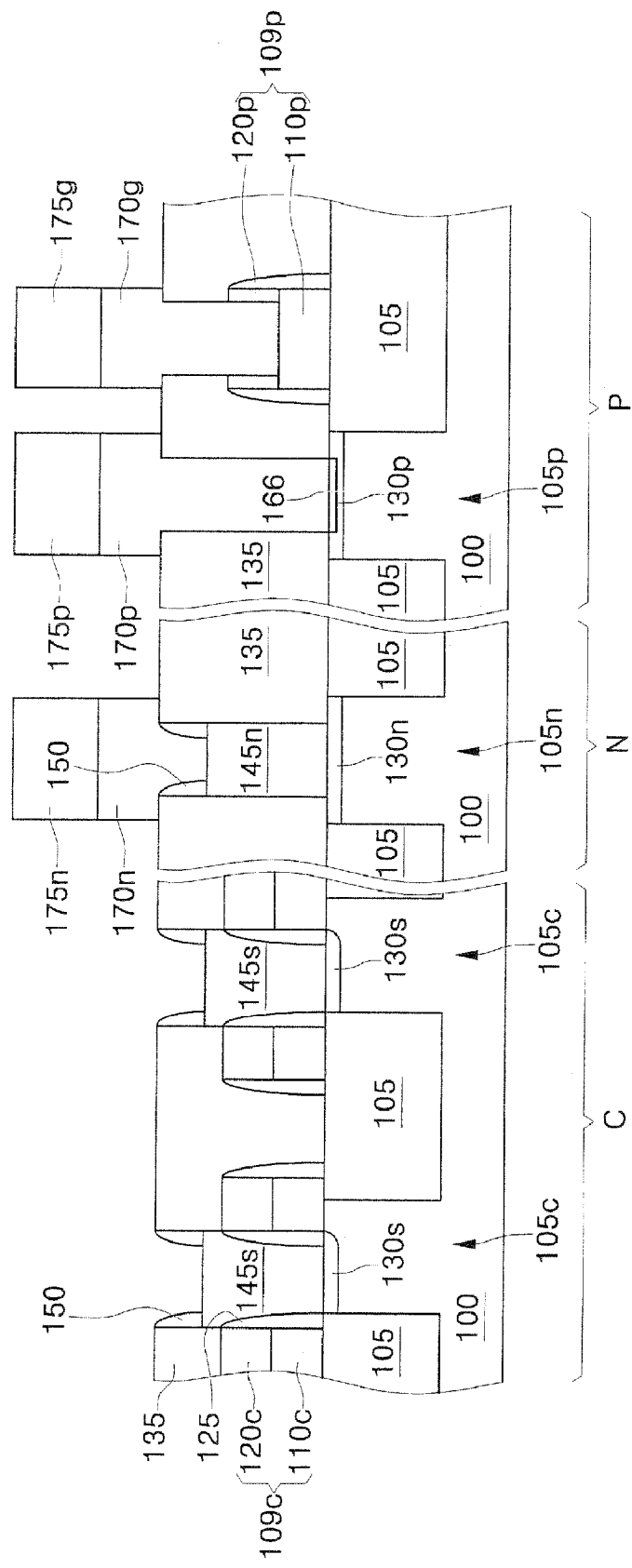

Referring to FIGS. 2, 8A, and 8B, the hard mask insulating layer 174 and the interconnection conductive layer 169 are sequentially patterned so as to expose a top surface of the interlayer-insulating layer 135 and top surfaces of the landing pads 145s, 145b, and 145n, so that a bit line 170b and a bit line hard mask layer pattern 175b are formed which cover a top surface of the bit line landing pad 145b and are sequentially stacked, NMOS metal interconnections 176n and an NMOS hard mask layer pattern 175n are formed which cover top surfaces of the NMOS landing pads 145n and are sequentially stacked, and PMOS metal interconnections 170p and PMOS hard mask layer patterns 175p are formed which cover top surfaces of the PMOS interconnection contact holes 155p and are sequentially stacked.

The bit line 170n above the bit line landing pad 145n may have a bit line contact 171b protruded from the bit line 170n to the bit line landing pad 145n to be in contact with the bit line landing pad 145n. The NMOS metal interconnections 165n above the NMOS landing pads 145n may have NMOS metal interconnection contacts 171n protruded from the NMOS metal interconnections 176n to the NMOS landing pads 145n to be in contact with the respective NMOS landing pads 145n. The PMOS metal interconnections 170p are in contact with predetermined regions of the PMOS active region 105p via the PMOS interconnection contact holes 155p. In this case, the PMOS metal interconnections 170p are in contact with the PMOS source and drain regions 130p of the PMOS transistor via the PMOS interconnection contact holes 155p. The PMOS metal interconnections 170p above the PMOS interconnection contact holes 155p have PMOS metal interconnection contacts 171p protruded from the PMOS metal interconnections 170p to the PMOS source and drain regions 130p to be in contact with the PMOS source and drain regions 130p.

In the meantime, when the PMOS gate interconnection contact hole 155g is formed, a PMOS gate metal interconnection 170g is formed which covers a top surface of the PMOS gate interconnection contact hole 155g and is in contact with a predetermined region of the PMOS gate electrode 110p via the PMOS gate interconnection contact hole 155g while the bit line 176b and the metal interconnections 176n and 176p are formed. In this case, a gate hard mask layer pattern 175g may be formed on the PMOS gate metal interconnection 170g.

Further, although not shown in the drawings, when the cell gate interconnection contact hole and the NMOS gate interconnection contact hole are formed, a cell gate metal interconnection and an NMOS gate metal interconnection are formed which cover the cell gate interconnection contact hole and the NMOS gate interconnection contact hole and are in contact with the cell gate electrode 110c and the NMOS gate electrode via the cell gate interconnection contact hole and the NMOS gate interconnection contact hole, respectively, while the PMOS gate metal interconnection 176g is formed.

As described above, after the landing pads 145s, 145b, and 145n are formed, a photolithography process may be carried out once before the bit line 170b and the metal interconnections 170n, 170p, and 170g are formed. As a result, the cost and time associated with the process may be reduced.

A semiconductor device according to exemplary embodiments of the invention will be described with reference to FIGS. 2, 8A, and 8B.

Referring to FIGS. 2, 8A, and 8B, a semiconductor substrate 100 has a cell region C, a core NMOS region N, and a core PMOS region P. An isolation layer 105 is disposed in a predetermined region of the semiconductor substrate 100. The isolation layer 105 may be a trench isolation layer. The isolation layer 105 defines a cell active region 105c, an NMOS active region 105n, and a PMOS active region 105p in the cell region C, the core NMOS region N, and the core PMOS region P, respectively. A cell transistor, an NMOS transistor, and a PMOS transistor are disposed on the cell active region 105c, the NMOS active region 105n, and the PMOS active region 105p, respectively. Specifically, a cell gate pattern 110c, an NMOS gate pattern 109n, and a PMOS gate pattern 109p are disposed which cross the cell active region 105c, the NMOS active region 105n, and the PMOS active region 105p and extend onto the isolation layer 105. Cell source and drain regions 130s and 130d, NMOS source and drain regions 130n, and PMOS source and drain regions 130p are respectively disposed in the active regions 105c, 105n, and 105p which are adjacent to the cell gate pattern 110c, the NMOS gate pattern 109n, and the PMOS gate pattern 109p, respectively. In this case, the cell source and drain regions 130s and 130d, the NMOS source and drain regions 130n may be regions where N-type impurity ions are implanted. The PMOS source and drain regions 130p may be regions where P-type impurity ions are implanted.

The cell gate pattern 105c may include a cell gate electrode 110c and a cell capping layer pattern 120c which are sequentially stacked, the NMOS gate pattern 109n may include an NMOS gate electrode (not shown) and an NMOS capping layer pattern (not shown) which are sequentially stacked, and the PMOS gate pattern 109p may include a PMOS gate electrode 110p and a PMOS capping layer pattern 120p which are sequentially stacked. In this case, a gate dielectric layer may be interposed between the gate electrodes and the active regions, respectively. The gate dielectric layer may be formed of a silicon oxide layer of a high-k dielectric layer. The gate electrodes may be formed of a polysilicon layer, a metal layer, or a polycide layer. The polycide layer may be a stacked layer of a polysilicon layer and a metal silicide layer. In this case, the metal silicide layer may be a tungsten silicide layer, a titanium silicide layer, or a cobalt silicide layer. As a result, the cell transistor may include the cell gate electrode 110c and the cell source and drain regions 130s and 130d, the NMOS transistor may include the NMOS gate electrode (not shown) and the NMOS source and drain regions 130n, and the PMOS transistor may include the PMOS gate electrode 110p and the PMOS source and drain regions 130p.

In the meantime, two parallel cell transistors may be disposed on one cell active region 105c. That is, a pair of parallel cell gate patterns may cross the cell active region 105c as shown in FIG. 2. As a result, a pair of cell transistors sharing one common cell drain region 130d may be disposed on the cell active region 105c.

Gate spacers 125 are formed to cover sidewalls of the gate patterns 109c, 109n, and 109p. The gate spacers 125 may be formed of a silicon oxide layer or a silicon nitride layer.

An interlayer-insulating layer 135 is disposed on the semiconductor substrate having the gate patterns 109c, 109n, and 109p. The interlayer-insulating layer 135 has a storage node contact hole 140s and a bit line contact hole 140n for opening predetermined regions of the cell active region 105c adjacent to the cell gate pattern 109c, respectively, NMOS interconnection contact holes 140n for opening predetermined regions of the NMOS active region 105n adjacent to the NMOS gate pattern 109n, and PMOS interconnection contact holes 140p for opening predetermined regions of the PMOS active region 105p adjacent to the PMOS gate pattern 109p. That is, the cell source region 130s and the cell drain region 130d are opened by the storage node contact hole 140s and the bit line contact hole 140n, and the NMOS source and drain regions 130n are opened by the NMOS interconnection contact holes 140n. The PMOS source and drain regions 130p are opened by the PMOS interconnection contact holes 140p. A top surface of the interlayer-insulating layer is preferably higher than top surfaces of the gate patterns 109c, 109n, and 109p. For example, the interlayer-insulating layer 135 may have a top surface higher than the top surfaces of the gate patterns 109c, 109n, and 109p by about 500 Å to 4000 Å. The interlayer-insulating layer 135 may be formed of a silicon oxide layer.

A storage node landing pad 145s, a bit line landing pad 145b, and NMOS landing pads 145n, which are in contact with predetermined regions of the active regions and have top surfaces lower than the top surface of the interlayer-insulating layer 135, are formed in the storage node contact hole 140s, the bit line contact hole 140b, and the NMOS interconnection contact holes 140n of the interlayer-insulating layer 135, respectively. As a result, upper sidewalls of the storage node contact hole 140s, the bit line contact hole 140b, and the NMOS interconnection contact holes 140n are exposed by the step between the interlayer-insulating layer 135 and each of the landing pads 145s, 145b, and 145n. The storage node landing pad 145s and the bit line landing pad 145b are electrically connected to the cell source region 130s and the cell drain region 130d, respectively. The NMOS landing pads 145n are electrically connected to the NMOS source and drain regions 130n.

Insulating spacers 150 can be disposed to cover the upper sidewalls of the storage node contact hole 140s, the bit line contact hole 140b, and the NMOS interconnection contact holes 140n exposed by the step between the interlayer-insulating layer 135 and each of the landing pads 145s, 145b, and 145n. The insulating spacers 150 may be formed of a silicon oxide layer or a silicon nitride layer.

A bit line 170b and NMOS metal interconnections 170n are disposed on the interlayer-insulating layer 135, respectively cover the bit line landing pad 145b and the NMOS landing pads 145n, and are in contact with the bit line landing pad 145b and the NMOS landing pads 145n. In this case, the bit line 170b above the bit line landing pad 145b may have a bit line contact 171b protruded from the bit line 170b to the bit line landing pad 145b to be in contact with the bit line landing pad 145b. The NMOS metal interconnections 170n above the NMOS landing pads 145n may have NMOS metal interconnection contacts 171n protruded from the NMOS metal interconnections 176n to the NMOS landing pads 145n to be in contact with the respective NMOS landing pads 145n.

PMOS metal interconnections 170p are disposed on the interlayer-insulating layer 135, disposed on the PMOS interconnection contact holes 155p, and are in contact with predetermined regions of the PMOS active region 105p. In this case, the PMOS metal interconnections 170p are in contact with the PMOS source and drain regions 130p of the PMOS transistor via the PMOS interconnection contact holes 155p. The PMOS metal interconnections 170p above the PMOS interconnection contact holes 155p have PMOS metal interconnection contacts 171p protruded from the PMOS metal interconnections 170p to the PMOS source and drain regions 130p to be in contact with the PMOS source and drain regions 130p.

In the meantime, the interlayer-insulating layer 135 further includes a PMOS gate interconnection contact hole 155g for opening a direct contact region of the PMOS gate pattern 109p. The direct contact region of the PMOS gate pattern 109p may mean a region for opening a predetermined region of the PMOS gate electrode 110p. A PMOS gate metal interconnection 170g is formed on the interlayer-insulating layer 135, covers the PMOS gate interconnection contact hole 155g, and is in contact with predetermined regions of the PMOS gate electrode 110p. The PMOS gate metal interconnection 170g above the PMOS gate interconnection contact hole 155g may have a PMOS gate electrode contact 171g protruded from the gate metal interconnection 170g to the PMOS gate electrode 110p to be in contact with a predetermined region of the PMOS gate electrode 10p. In this case, the PMOS gate metal interconnection 170g is electrically connected to the PMOS gate electrode 110p via the PMOS gate interconnection contact hole 155g. Hard mask layer patterns 175b, 175n, 175p, and 175g may be formed on the bit line 170b, the NMOS metal interconnections 170n, the PMOS metal interconnections 170g, and the PMOS gate metal interconnection 170g, respectively.

Further, although not shown in the drawings, a cell gate metal interconnection and an NMOS gate metal interconnection may be disposed to be electrically connected to predetermined regions of the cell gate electrode 10c and the NMOS gate electrode 110n. That is, the cell gate metal interconnection and the NMOS gate metal interconnection substantially having the same structure as the PMOS gate metal interconnection 170g contacting a predetermined region of the PMOS gate electrode 110p may be formed.

According to embodiments of the invention, the core NMOS region N and the core PMOS region P described above are not limited to core regions of the semiconductor memory device. That is, a NMOS region N and a PMOS region P like the ones described above in relation to the core region may alternatively be found in or may additionally be found in a peripheral circuit region of the semiconductor device.

According to the exemplary embodiments described above, the direct contact process can be simplified. That is, after the landing pads are formed, the photolithography process can be carried out once before the bit line and the metal interconnections are formed. Consequently, the cost and time associated with the process may be reduced.

The invention may be practiced in many ways. What follows are exemplary, non-limiting descriptions of embodiments of the invention.

According to some embodiments, a method of fabricating a semiconductor device includes preparing a semiconductor substrate having a cell region, a core NMOS region and a core PMOS region. An isolation layer is formed in a predetermined region of the semiconductor substrate to form a cell active region, an NMOS active region, and a PMOS active region in the cell region, the core NMOS region, and the core PMOS region, respectively. A cell gate pattern, an NMOS gate pattern, and a PMOS gate pattern are formed across the cell active region, the NMOS active region, and the PMOS active region, respectively. An interlayer-insulating layer is formed on the semiconductor substrate having the gate patterns. A storage node landing pad and a bit line landing pad which are respectively in contact with predetermined regions of the cell active region adjacent to the cell gate pattern are formed in the interlayer-insulating layer of the cell region while NMOS landing pads in contact with predetermined regions of the NMOS active region adjacent to the NMOS gate pattern are formed in the interlayer-insulating layer of the core NMOS region. In this case, each of the landing pads has a top surface lower than a surface of the interlayer-insulating layer. The interlayer-insulating layer of the core PMOS region is patterned to form PMOS interconnection contact holes for exposing predetermined regions of the PMOS active region adjacent to the PMOS gate pattern.

According to some embodiments, the gate patterns may be composed of gate electrodes and capping layer patterns which are sequentially stacked.

According to some embodiments, after the gate patterns are formed, the method may further include forming gate spacers for covering sidewalls of the gate patterns.

According to some embodiments, forming the landing pads may include patterning the interlayer-insulating layer of the cell region and the core NMOS region and forming a storage node contact hole and a bit line contact hole for exposing predetermined regions of the cell active region adjacent to the cell gate pattern, respectively while forming NMOS interconnection contact holes for exposing predetermined regions of the NMOS active region adjacent to the NMOS gate pattern; forming a pad conductive layer for filling the contact holes on the interlayer-insulating layer; and etching the pad conductive layer to expose a top surface of the interlayer-insulating layer and forming the landing pads remaining in lower regions of the contact holes.

According to some embodiments, the landing pads may be formed of a polysilicon layer or a tungsten layer.

According to some embodiments, the method may further include, after the formation of the storage node landing pad, the bit line landing pad, and the NMOS landing pads, forming an insulating spacer for covering sidewalls of the interlayer-insulating layer exposed by a step between the interlayer-insulating layer and each top surface of the landing pads. In this case, the insulating spacer may be formed of a silicon oxide layer or a silicon nitride layer.

According to some embodiments, the method may further include, after the formation of the PMOS interconnection contact holes, implanting P-type impurity ions into the PMOS active regions exposed by the PMOS interconnection contact holes to form impurity regions.

According to some embodiments, the method may further include patterning the interlayer-insulating layer and forming PMOS interconnection contact holes while forming gate interconnection contact holes for exposing direct contact regions of the gate patterns.

According to some embodiments, the method may further include, after the formation of the PMOS interconnection contact holes in the interlayer-insulating layer, forming an interconnection conductive layer for filling the PMOS interconnection contact holes on the entire surface of the interlayer-insulating layer; and patterning the interconnection conductive layer to form a bit line which covers a top surface of the bit line landing pad and is in contact with the bit line landing pad, NMOS metal interconnections which cover top surfaces of the NMOS landing pads and are in contact with the NMOS landing pads, and PMOS metal interconnections which cover top surfaces of the PMOS interconnection contact holes and are in contact with the PMOS active regions via the PMOS interconnection contact holes.

According to some embodiments, a semiconductor device includes a semiconductor substrate having a cell region, a core NMOS region, and a core PMOS region. An isolation layer is disposed in a predetermined region of the semiconductor substrate to define a cell active region, an NMOS active region, and a PMOS active region in the cell region, the core NMOS region, and the core PMOS region, respectively. A cell gate pattern, an NMOS gate pattern, and a PMOS gate pattern are disposed across the cell active region, the NMOS active region, and the PMOS active region, respectively. An interlayer-insulating layer is disposed on the semiconductor substrate having the gate patterns, wherein the interlayer-insulating layer has a storage node contact hole and a bit line contact hole for opening predetermined regions of the cell active region adjacent to the cell gate pattern, respectively, NMOS interconnection contact holes for opening predetermined regions of the NMOS active region adjacent to the NMOS gate pattern, and PMOS interconnection contact holes for opening predetermined regions of the PMOS active region adjacent to the PMOS gate pattern. A storage node landing pad, a bit line landing pad, and NMOS landing pads, which have top surfaces lower than a top surface of the interlayer-insulating layer and are in contact with predetermined regions of the active regions, are disposed in the storage node contact hole, the bit line contact hole, and the NMOS interconnection contact holes of the interlayer-insulating layer, respectively. A bit line and NMOS metal interconnections are disposed on the interlayer-insulating layer to cover and contact top surfaces of the bit line landing pad and the NMOS landing pads, respectively. PMOS metal interconnections are disposed on the interlayer-insulating layer to cover top surfaces of the PMOS interconnection contact holes. In this case, the PMOS metal interconnections have PMOS metal interconnection contacts protruded downward to be in contact with predetermined regions of the PMOS active region above the PMOS interconnection contact holes.

According to some embodiments, the gate patterns may include gate electrodes and capping layer patterns which are sequentially stacked.

According to some embodiments, the semiconductor device may further include gate spacers for covering sidewalls of the gate patterns.

According to some embodiments, the semiconductor device may further include an insulating spacer for covering upper sidewalls of the storage node contact hole, the bit line contact hole, and the NMOS interconnection contact holes exposed by a step between the interlayer-insulating layer and each of the storage node landing pad, the bit line landing pad and the NMOS landing pads.

According to some embodiments, the semiconductor device may further include gate metal interconnections formed on the interlayer-insulating layer and penetrating the interlayer-insulating layer to be in contact with direct contact regions of the gate patterns.

A method of fabricating a semiconductor device and a semiconductor device fabricated thereby are provided. The method includes forming an isolation layer in a semiconductor substrate having a cell region, a core NMOS region, and a core PMOS region to define a cell active region, an NMOS active region, and a PMOS active region, respectively. A cell gate pattern, an NMOS gate pattern, and a PMOS gate pattern are formed across the cell active region, the NMOS active region, and the PMOS active region, respectively. An interlayer-insulating layer is formed on the semiconductor substrate having the gate patterns. A storage node landing pad and a bit line landing pad which are respectively in contact with predetermined regions of the cell active region adjacent to the cell gate pattern are formed in the interlayer-insulating layer of the cell region while NMOS landing pads in contact with predetermined regions of the NMOS active region adjacent to the NMOS gate pattern are formed in the interlayer-insulating layer of the core NMOS region. In this case, each of the landing pads has a top surface lower than a surface of the interlayer-insulating layer. The interlayer-insulating layer of the core PMOS region is patterned to form PMOS interconnection contact holes for exposing predetermined regions of the PMOS active region adjacent to the PMOS gate pattern.

Exemplary embodiments of the invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

The invention claimed is:

1. A method of fabricating a semiconductor device, the method comprising:
   preparing a semiconductor substrate having a cell region, a core N-channel metal oxide semiconductor (NMOS) region, and a core P-channel MOS (PMOS) region;
   defining a cell active region, an NMOS active region, and a PMOS active region in the cell region, the core NMOS region, and the core PMOS region, respectively, by forming an isolation layer in predetermined regions of the semiconductor substrate;
   forming a cell gate pattern, an NMOS gate pattern, and a PMOS gate pattern crossing the cell active region, the NMOS active region, and the PMOS active region, respectively;
   forming an interlayer-insulating layer on the semiconductor substrate having the gate patterns;
   simultaneously forming a storage node landing pad, a bit line landing pad, and NMOS landing pads, the storage node landing pad and the bit line landing pad in physical contact with predetermined regions of the cell active region adjacent to the cell gate pattern in the interlayer-insulating layer of the cell region, the NMOS landing pads in physical contact with predetermined regions of the NMOS active region adjacent to the NMOS gate pattern in the interlayer-insulating layer of the core NMOS region, each of the storage node, bit line, and NMOS landing pads having a top surface that is lower than a surface of the interlayer-insulating layer; and
   patterning the interlayer-insulating layer of the core PMOS region to form PMOS interconnection contact holes that expose predetermined regions of the PMOS active region adjacent to the PMOS gate pattern.

2. The method of claim 1, wherein forming the cell gate pattern, the NMOS gate pattern, and the PMOS gate pattern comprises forming gate electrodes and capping layer patterns on the gate electrodes, the capping layer patterns contiguous with the gate electrodes.

3. The method of claim 1, further comprising covering sidewalls of the cell gate pattern, the NMOS gate pattern, and the PMOS gate pattern with gate spacers, the gate spacers abutting the sidewalls.

4. The method of claim 1, wherein simultaneously forming the storage node landing pad, the bit line landing pad, and the NMOS landing pads comprises:
   patterning the interlayer-insulating layer in the cell region and the core NMOS region to form a storage node contact hole and a bit line contact hole that expose predetermined regions of the cell active region adjacent to the cell gate pattern, and to form NMOS interconnection contact holes that expose a predetermined region of the NMOS active region adjacent to the NMOS gate pattern;
   filling the storage node contact hole, the bit line contact hole, and the NMOS interconnection contact holes with a pad conductive layer that is formed on the interlayer-insulating layer; and
   etching the pad conductive layer to expose a top surface of the interlayer-insulating layer.

5. The method of claim 1, wherein simultaneously forming the storage node landing pad, the bit line landing pad, and the NMOS landing pad comprises depositing a polysilicon layer.

6. The method of claim 1, wherein simultaneously forming the storage node landing pad, the bit line landing pad, and the NMOS landing pad comprises depositing a tungsten layer.

7. The method of claim 1, further comprising, after forming the storage node landing pad, the bit line landing pad, and the NMOS landing pad, forming an insulating spacer for covering sidewalls of the interlayer-insulating layer exposed by a step between the interlayer-insulating layer and each top surface of the landing pads.

8. The method according of claim 7, wherein forming the insulating spacer comprises forming a silicon oxide layer.

9. The method of claim 7, wherein forming the insulating spacers comprises forming a silicon nitride layer.

10. The method of claim 1, further comprising, after forming the PMOS interconnection contact holes, implanting P-type impurity ions into the PMOS active regions exposed by the PMOS interconnection contact holes to form impurity regions.

11. The method of claim 1, further comprising, concurrently with patterning the interlayer-insulating layer of the core PMOS region to form PMOS interconnection contact holes, patterning the interlayer-insulating layer to form gate interconnection contact holes for exposing direct contact regions of the gate patterns.

12. The method of 1, further comprising, after forming the PMOS interconnection contact holes in the interlayer-insulating layer:
   filling the PMOS interconnection contact holes with an interconnection conductive layer formed on a surface of the interlayer-insulating layer; and
   patterning the interconnection conductive layer to form a bit line that covers a top surface of the bit line landing pad and is in contact with the bit line landing pad, to form NMOS metal interconnections that cover top surfaces of the NMOS landing pads and are in physical contact with the NMOS landing pads, and to form PMOS metal interconnections that cover top surfaces of the PMOS interconnection contact holes and are in physical contact with the PMOS active regions via the PMOS interconnection contact holes.

* * * * *

UNITED STATES PATENT AND TRADEMARK OFFICE
CERTIFICATE OF CORRECTION

PATENT NO. : 7,361,591 B2
APPLICATION NO. : 11/279364
DATED : April 22, 2008
INVENTOR(S) : Je-Min Park It is certified that error appears in the above-identified patent and that said Letters Patent is hereby corrected as shown below:

Column 10, line 13, the word "10p" should read -- 110p --;
Column 10, line 24, the word "10c" should read -- 110c --.

Signed and Sealed this

Eleventh Day of November, 2008

JON W. DUDAS
*Director of the United States Patent and Trademark Office*